US008525576B2

(12) United States Patent
Tsai et al.

(10) Patent No.: US 8,525,576 B2
(45) Date of Patent: Sep. 3, 2013

(54) SOLID STATE DRIVE AND CONTROLLING METHOD THEREOF

(75) Inventors: Song-Feng Tsai, Hsinchu (TW); Jen-Yu Hsu, Hsinchu (TW); Shih-Chiang Lu, Hsinchu (TW)

(73) Assignee: Lite-On It Corporation, Taipei (TW)

( * ) Notice: Subject to any disclaimer, the term of this patent is extended or adjusted under 35 U.S.C. 154(b) by 50 days.

(21) Appl. No.: 13/337,677

(22) Filed: Dec. 27, 2011

(65) Prior Publication Data
US 2013/0021088 A1 Jan. 24, 2013

(30) Foreign Application Priority Data
Jul. 21, 2011 (CN) .......................... 2011 1 0204669

(51) Int. Cl.
*H01L 35/00* (2006.01)
(52) U.S. Cl.
USPC ........................................... 327/513
(58) Field of Classification Search
USPC ................................ 327/512, 513
See application file for complete search history.

(56) References Cited

U.S. PATENT DOCUMENTS

| 7,149,645 | B2* | 12/2006 | Mangrulkar et al. | ......... 702/130 |
|---|---|---|---|---|
| 8,359,412 | B2* | 1/2013 | Park et al. | .................. 710/33 |
| 8,379,427 | B2* | 2/2013 | Sugita et al. | ................. 365/51 |
| 8,397,011 | B2* | 3/2013 | Ashwood | ..................... 711/5 |

* cited by examiner

*Primary Examiner* — Jeffrey Zweizig
(74) *Attorney, Agent, or Firm* — WPAT, PC; Justin King

(57) ABSTRACT

A controlling method is provided for preventing a solid state drive from being operated at a high temperature. The solid state drive includes a controlling circuit, a temperature detecting circuit and a plurality of dies. The dies are divided into n groups and accessed by the controlling circuit through n IO buses. The controlling circuit is in communication with the temperature detecting circuit for detecting a temperature of the solid state drive. The controlling method includes the following steps. Firstly, a judging step is performed to judge whether the temperature of the solid state drive is higher than a predetermined temperature. If the temperature of the solid state drive is higher than the predetermined temperature, the frequencies of n clock signals in the n IO buses are decreased.

9 Claims, 3 Drawing Sheets

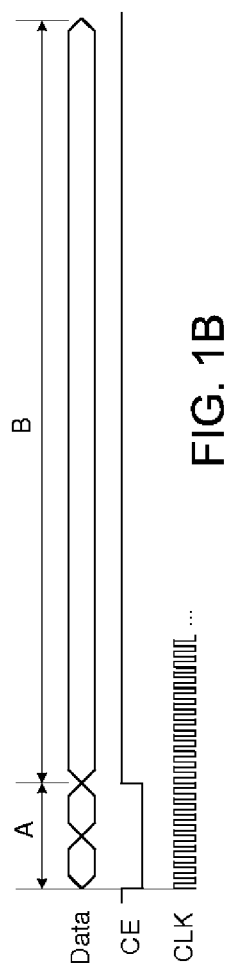
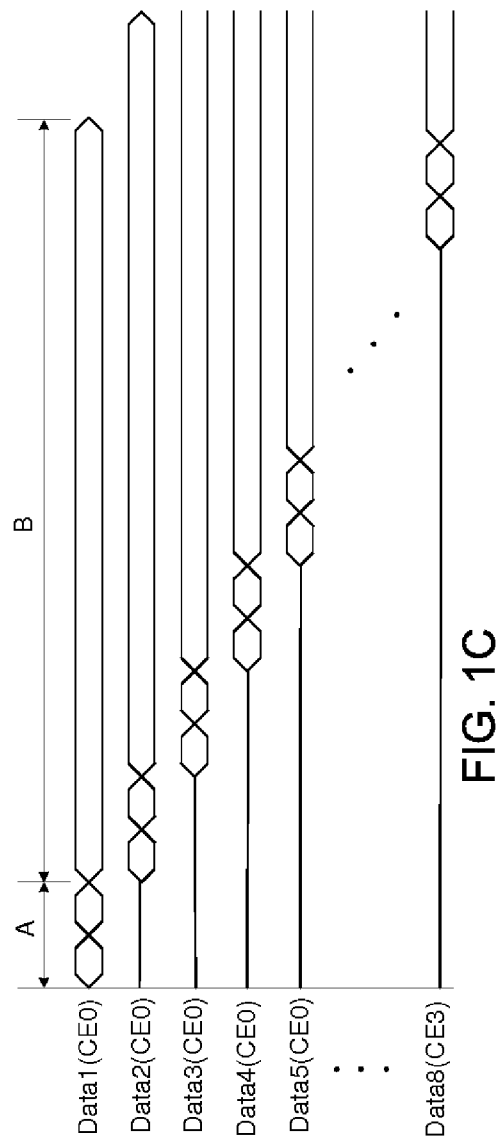

SOLID STATE DRIVE AND CONTROLLING METHOD THEREOF

This application claims the benefit of People's Republic of China application Serial No. 201110204669.9, filed Jul. 21, 2011, the subject matter of which is incorporated herein by reference.

FIELD OF THE INVENTION

The present invention relates to a solid state drive and a controlling method thereof, and more particularly to a solid state drive and a controlling method for preventing the solid state drive from being operated at a high temperature.

BACKGROUND OF THE INVENTION

As is well known, a solid state drive (SSD) is a data storage device that uses a NAND-based flash memory to store data. The NAND-based flash memory is a non-volatile memory. After data are written to the flash memory, if no power is supplied to the flash memory, the data are still retained in the flash memory.

As the storage capacity of the current solid state drive is gradually increased, the accessing speed is increased and the solid state drive can be used in diverse environments. Take the solid state drive complying with the industrial specifications for example. Such a solid state drive is normally operated under the operating temperature of $-40°$ C.~$+85°$ C. However, since the solid state drive is usually unstable under the high temperature condition, the possibility of erroneously writing data into the solid state drive or reading data from the solid state drive is increased.

Therefore, there is a need of providing a control method for a solid state drive in order to enhancing the operating stability of the solid state drive under a high temperature condition.

SUMMARY OF THE INVENTION

A first embodiment of the present invention provides a controlling method for a solid state drive. The solid state drive includes a controlling circuit, a temperature detecting circuit and a plurality of dies. The dies are divided into n groups and accessed by the controlling circuit through n IO buses. The controlling circuit is in communication with the temperature detecting circuit for detecting a temperature of the solid state drive. The controlling method includes the following steps. Firstly, a judging step is performed to judge whether the temperature of the solid state drive is higher than a predetermined temperature. If the temperature of the solid state drive is higher than the predetermined temperature, the frequencies of n clock signals in the n IO buses are decreased.

A second embodiment of the present invention provides a controlling method for a solid state drive. The solid state drive includes a controlling circuit, a temperature detecting circuit and a plurality of dies. The dies are divided into n groups and accessed by the controlling circuit through n IO buses. The controlling circuit is in communication with the temperature detecting circuit for detecting a temperature of the solid state drive. The controlling method includes the following steps. Firstly, a judging step is performed to judge whether the temperature of the solid state drive is higher than a predetermined temperature. If the temperature of the solid state drive is higher than the predetermined temperature, an operating frequency of the controlling circuit is decreased.

A third embodiment of the present invention provides a controlling method for a solid state drive. The solid state drive includes a controlling circuit, a temperature detecting circuit and a plurality of dies. The dies are divided into n groups and accessed by the controlling circuit through n IO buses. The controlling circuit is in communication with the temperature detecting circuit for detecting a temperature of the solid state drive. The controlling method includes the following steps. Firstly, a judging step is performed to judge whether the temperature of the solid state drive is higher than a predetermined temperature. If the temperature of the solid state drive is higher than the predetermined temperature, the controlling circuit generates a predetermined time delay between every two successive command cycles, wherein a single command cycle is generated when a single die is accessed by the controlling circuit.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1B is a schematic timing diagram illustrating associated signals during a process of writing data into a specified 4 GByte die of a flash memory IC by the controlling circuit;

FIG. 1C is a schematic timing diagram illustrating the signals processed by the controlling circuit of the flash memory at the highest speed.

DETAILED DESCRIPTION OF PREFERRED EMBODIMENTS

Figure 1A:
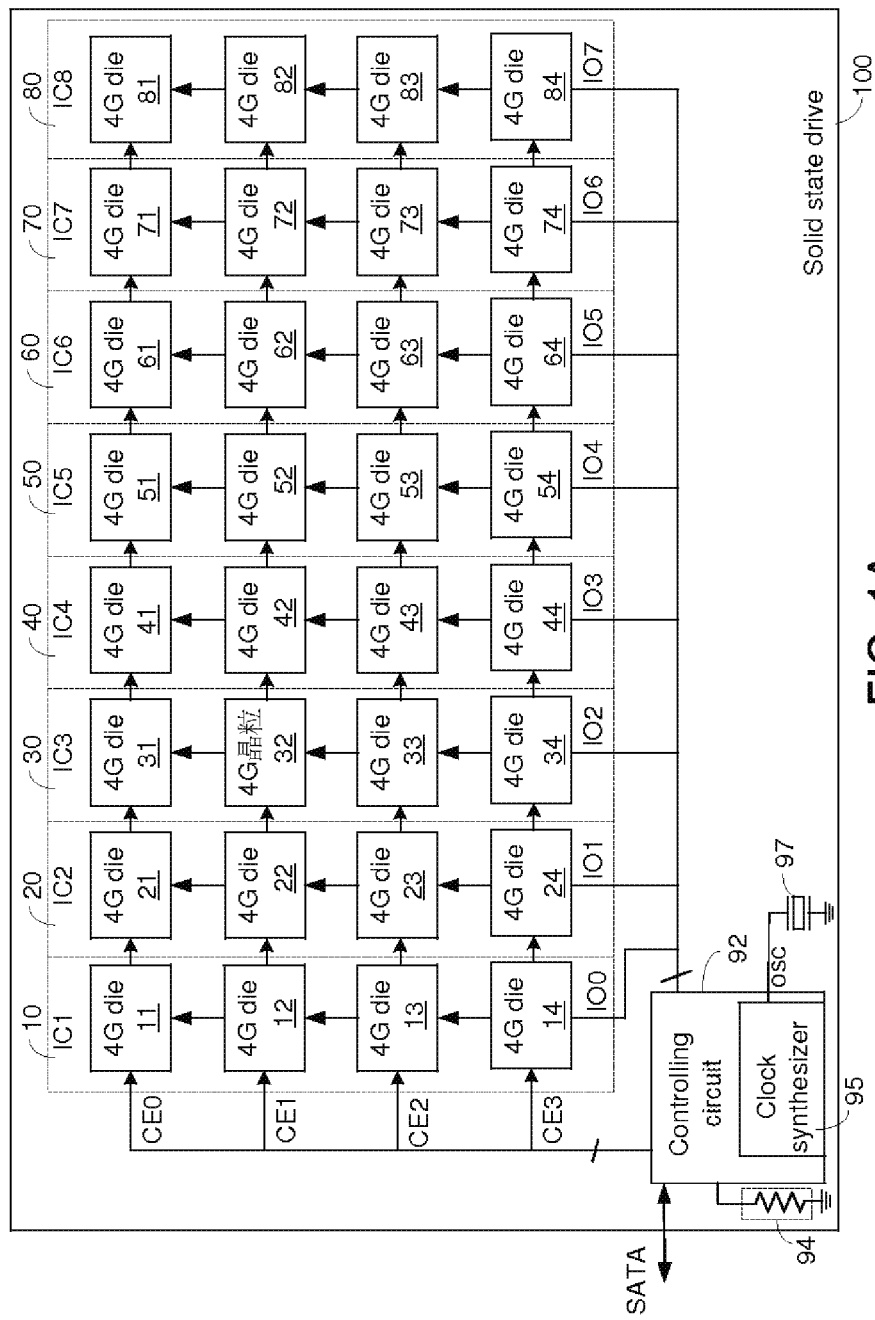
FIG. 1A is a schematic circuit diagram illustrating a solid state drive according to an embodiment of the present invention.

FIG. 1A is a schematic circuit diagram illustrating a solid state drive according to an embodiment of the present invention. For increasing the storage capacity of the solid state drive 100, a plurality of flash memory ICs 10~80 are installed on the circuit board of the solid state drive 100. In this embodiment, the storage capacity of the solid state drive 100 is 128 GByte. In addition, the solid state drive 100 is connected to a host (not shown) through an external bus (e.g. a SATA bus or USB bus).

As shown in FIG. 1A, the solid state drive 100 comprises eight flash memory ICs 10~80, a controlling circuit 92, an oscillator 97, and a temperature detecting circuit 94. Each of the flash memory ICs 10~80 comprises four 4 GByte dies. The temperature detecting circuit 94 is configured for providing an ambient temperature signal to the controlling circuit 92. An example of the temperature detecting circuit 94 is a thermistor. Moreover, the controlling circuit 92 further comprises a clock synthesizer 95 for receiving an oscillation signal (osc) from the oscillator 97. According to the oscillation signal (osc), the controlling circuit 92 generates various clock signals.

Please refer to FIG. 1A again. The first flash memory IC (IC1) 10 comprises four 4 GByte dies 11~14. These 4 GByte dies 11~14 are connected to the controlling circuit 92 for receiving the enabling signals CE0~CE3, respectively. Similarly, the four 4 GByte dies of each of the flash memory ICs 20~80 also receive the enabling signals CE0~CE3, respectively. In addition, the controlling circuit 92 has eight channel IO buses IO0~IO7. These IO buses IO0~IO7 are respectively connected with the flash memory ICs 10~80.

In addition, IO bus has individual data line and clock line. That is, the solid state drive 100 of FIG. 1A comprises eight clock lines and eight groups of data lines.

FIG. 1B is a schematic timing diagram illustrating associated signals during a process of writing data into a specified 4 GByte die of a flash memory IC by the controlling circuit 92. In an embodiment, the controlling circuit 92 is operated at a clock frequency of 275 MHz. The clock signal (CLK) in the IO bus is operated at an operating frequency of 200 MHz or higher.

Please refer to FIG. 1B again. During the time period A (i.e. a command cycle), a 4 GByte die is enabled in response to the enabling signal CE. Consequently, a command and address cycle and a data and command write cycle are sequentially assigned to a corresponding group of data lines by the controlling circuit 92. For example, the time period A of the command cycle is about 30~80 µs.

After the command cycle, the write address and the write data have been received by the 4 GByte die. Consequently, a writing operation is performed to write the data into the 4 GByte die during the time period B (e.g. a data write cycle). That is, the 4 GByte die is operated in a busy state during the time period B of the data write cycle. In the busy state, the 4 GByte die is not accessible in response to any command. For example, the time period B of the data write cycle is about 1~3 ms.

Generally, the time period B is much longer than the time period A. For achieving the highest accessing speed of the solid state drive 100, all of the 4 GByte dies are possibly in the busy state to perform the writing operations at the same time spot during the data write cycles of respective 4 GByte dies. At this moment, the solid state drive 100 has the highest power consumption and generates the highest amount of heat.

FIG. 1C is a schematic timing diagram illustrating the signals processed by the controlling circuit of the flash memory at the highest speed. For example, in response to the enabling signal CE0, the 4 GByte die 11 is enabled, and a command cycle is assigned to the 4 GByte die 11 through the first data line (Data1) of the first IO bus (IO1). During the time period B of the data write cycle, the 4 GByte die 11 is operated in a busy state.

As previously described, the time period B is much longer than the time period A. During the data write cycle of the 4 GByte die 11, the controlling circuit 92 also sequentially assigns thirty-one command cycles to the thirty-one 4 GByte dies 21~84 by means of the enabling signals CE0~CE3 and the IO buses IO0~IO7. Obviously, after the final command cycle is assigned, all of the 4 GByte dies 11~84 are possibly operated during the data write cycle (i.e. in the busy state). Under this circumstance, the solid state drive 100 has the highest power consumption and generates the highest amount of heat.

Hereinafter, for clarification and brevity, only the data writing operation of the solid state drive at the highest speed will be illustrated. It is noted that the controlling method of the present invention may be applied to the data reading operation and the data erasing operation of the solid state drive at the highest speed.

In accordance with the present invention, the ambient temperature of the solid state drive 100 is continuously detected by the temperature detecting circuit 94 of the solid state drive 100. If the ambient temperature of the solid state drive 100 is higher than a predetermined temperature (e.g. 70° C.), a protecting action will be enabled in order to prevent from occurrence of the systematic instability.

In accordance with a first controlling mechanism of the protecting action, the clock synthesizer 95 of the controlling circuit 92 is controlled to reduce the frequencies of the eight clock signals in the IO buses IO0~IO7, for example from 200 MHz to 166 MHz. Consequently, the number of 4 GByte dies operated in the busy state during the fixed time period will be effectively reduced. Under this circumstance, since the heat generated by the solid state drive 100 is reduced, the temperature of the solid state drive 100 will be effectively reduced.

In accordance with a second controlling mechanism of the protecting action, the clock synthesizer 95 is controlled to reduce the operating frequency of the controlling circuit 92, for example from 275 MHz to 200 MHz. Under this circumstance, since the heat generated by the solid state drive 100 is reduced, the temperature of the solid state drive 100 will be effectively reduced.

In accordance with a third controlling mechanism of the protecting action, the controlling circuit generates a predetermined time delay between every two successive command cycles to replace the consecutive command cycles at the highest speed. Since every two successive command cycles are separated from each other by the predetermined time delay, the possibility of allowing all of the 4 GByte dies to perform the writing operations at the same time spot during the data write cycles of respective 4 GByte dies will be minimized. Consequently, the number of 4 GByte dies operated in the busy state during the fixed time period will be effectively reduced. Under this circumstance, since the heat generated by the solid state drive 100 is reduced, the temperature of the solid state drive 100 will be effectively reduced.

Figure 2:
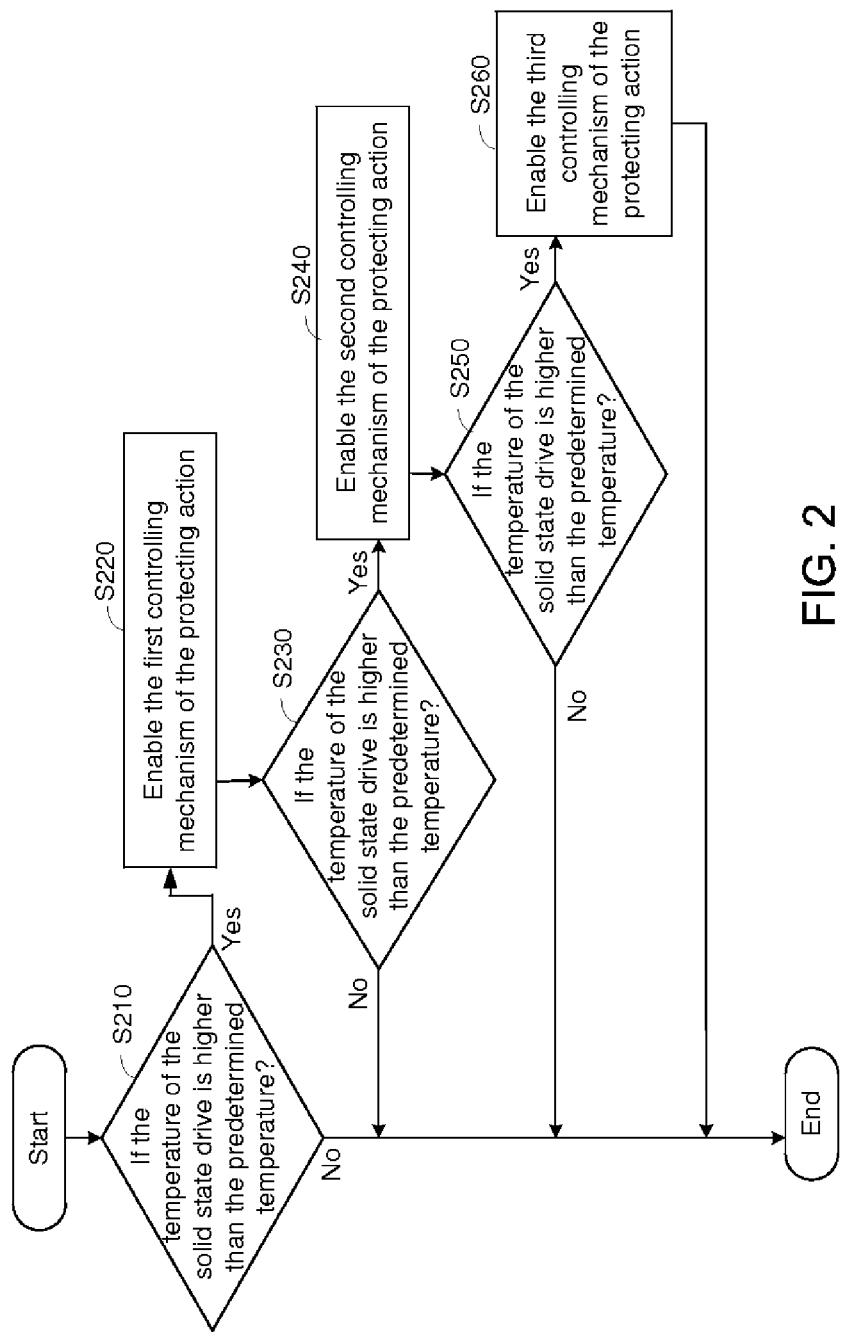
FIG. 2 is a flowchart illustrating a control method for a solid state drive according to an embodiment of the present invention.

FIG. 2 is a flowchart illustrating a control method for a solid state drive according to an embodiment of the present invention. After the solid state drive 100 is activated, the temperature of the solid state drive 100 is continuously detected by the temperature detecting circuit 94 (Step S210). If the temperature of the solid state drive 100 is lower than the predetermined temperature, the protecting action is disabled. On the other hand, if the temperature of the solid state drive 100 is higher than the predetermined temperature, the first controlling mechanism of the protecting action is enabled (Step S220). Under this circumstance, the frequencies of the eight clock signals in the IO buses IO0~IO7 are reduced.

After the frequencies of the eight clock signals in the IO buses IO0~IO7 are reduced, the temperature of the solid state drive 100 is continuously detected by the temperature detecting circuit 94 (Step S230). If the temperature of the solid state drive 100 is lower than the predetermined temperature, the protecting action is disabled. On the other hand, if the temperature of the solid state drive 100 is still higher than the predetermined temperature, the second controlling mechanism of the protecting action is enabled (Step S240). Under this circumstance, the operating frequency of the controlling circuit 92 is reduced.

After the operating frequency of the controlling circuit 92 is reduced, the temperature of the solid state drive 100 is continuously detected by the temperature detecting circuit 94 (Step S250). If the temperature of the solid state drive 100 is lower than the predetermined temperature, the protecting action is disabled. On the other hand, if the temperature of the solid state drive 100 is still higher than the predetermined temperature, the third controlling mechanism of the protecting action is enabled (Step S260). Under this circumstance, the controlling circuit generates a predetermined time delay between every two successive command cycles. Of course, the predetermined time delay may be shortened or extended according to the temperature of the solid state drive 100.

It is noted that the sequence of the above three controlling mechanisms may be varied according to the practical requirements. That is, the sequence of these three controlling mechanisms may be exchanged. Moreover, it is not necessary to employ all of the three controlling mechanisms. That is, one or two of the three controlling mechanisms may be employed to achieve the purpose of reducing the temperature of the solid state drive 100.

From the above description, the present invention provides a controlling method for preventing the solid state drive from being operated at a high temperature. Consequently, the operations of the solid state drive will be more stable.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A controlling method for a solid state drive, the solid state drive comprising a controlling circuit, a temperature detecting circuit and a plurality of dies, the dies being divided into n groups and accessed by the controlling circuit through n IO buses, the controlling circuit being in communication with the temperature detecting circuit for detecting a temperature of the solid state drive, the controlling method comprising steps of:
   judging whether the temperature of the solid state drive is higher than a predetermined temperature; and
   if the temperature of the solid state drive is higher than the predetermined temperature, decreasing the frequencies of n clock signals in the n IO buses.

2. The controlling method as claimed in claim 1, wherein after the frequencies of the n clock signals in the n IO buses are decreased, the controlling method further comprises steps of:
   judging whether the temperature of the solid state drive is higher than the predetermined temperature; and
   if the temperature of the solid state drive is higher than the predetermined temperature, decreasing an operating frequency of the controlling circuit.

3. The controlling method as claimed in claim 1, wherein after the frequencies of the n clock signals in the n IO buses are reduced, the controlling method further comprises steps of:
   judging whether the temperature of the solid state drive is higher than the predetermined temperature; and
   if the temperature of the solid state drive is higher than the predetermined temperature, generating a predetermined time delay between every two successive command cycles, wherein a single command cycle is generated when a single die is accessed by the controlling circuit.

4. A controlling method for a solid state drive, the solid state drive comprising a controlling circuit, a temperature detecting circuit and a plurality of dies, the dies being divided into n groups and accessed by the controlling circuit through n IO buses, the controlling circuit being in communication with the temperature detecting circuit for detecting a temperature of the solid state drive, the controlling method comprising steps of:
   judging whether the temperature of the solid state drive is higher than a predetermined temperature; and
   if the temperature of the solid state drive is higher than the predetermined temperature, decreasing an operating frequency of the controlling circuit.

5. The controlling method as claimed in claim 4, wherein after the operating frequency of the controlling circuit is decreased, the controlling method further comprises steps of:
   judging whether the temperature of the solid state drive is higher than the predetermined temperature; and
   if the temperature of the solid state drive is higher than the predetermined temperature, decreasing the frequencies of n clock signals in the n IO buses.

6. The controlling method as claimed in claim 4, wherein after the operating frequency of the controlling circuit is decreased, the controlling method further comprises steps of:
   judging whether the temperature of the solid state drive is higher than the predetermined temperature; and
   if the temperature of the solid state drive is higher than the predetermined temperature, generating a predetermined time delay between every two successive command cycles, wherein a single command cycle is generated when a single die is accessed by the controlling circuit.

7. A controlling method for a solid state drive, the solid state drive comprising a controlling circuit, a temperature detecting circuit and a plurality of dies, the dies being divided into n groups and accessed by the controlling circuit through n IO buses, the controlling circuit being in communication with the temperature detecting circuit for detecting a temperature of the solid state drive, the controlling method comprising steps of:
   judging whether the temperature of the solid state drive is higher than a predetermined temperature; and
   if the temperature of the solid state drive is higher than the predetermined temperature, generating a predetermined time delay between every two successive command cycles, wherein a single command cycle is generated when a single die is accessed by the controlling circuit.

8. The controlling method as claimed in claim 7, wherein after the predetermined time delay between every two successive command cycles is generated, the controlling method further comprises steps of:
   judging whether the temperature of the solid state drive is higher than the predetermined temperature; and
   if the temperature of the solid state drive is higher than the predetermined temperature, decreasing the frequencies of n clock signals in the n IO buses.

9. The controlling method as claimed in claim 7, wherein after the predetermined time delay between every two successive command cycles is generated, the controlling method further comprises steps of:
   judging whether the temperature of the solid state drive is higher than the predetermined temperature; and
   if the temperature of the solid state drive is higher than the predetermined temperature, decreasing an operating frequency of the controlling circuit.

* * * * *